United States Patent
Lo

[19]

[11] Patent Number: 6,145,586
[45] Date of Patent: Nov. 14, 2000

[54] HEAT SINK MODULE WITH HEAT DISSIPATING DEVICE

[75] Inventor: Wei Ta Lo, Miou Li, Taiwan

[73] Assignee: Foxconn Precision Components Co., Ltd., Taipei Hsien, Taiwan

[21] Appl. No.: 09/450,842

[22] Filed: Nov. 29, 1999

[30] Foreign Application Priority Data

Sep. 23, 1999 [TW] Taiwan ................................ 88216272

[51] Int. Cl.⁷ ................................ F28F 7/00; F24H 3/02; H05U 7/20
[52] U.S. Cl. ........................ 165/80.3; 361/697; 165/122
[58] Field of Search ................................ 165/80.3, 185, 165/121, 122; 361/697; 257/718, 719

[56] References Cited

U.S. PATENT DOCUMENTS

| | | | |
|---|---|---|---|
| 5,019,880 | 5/1991 | Higgins, III | 165/80.3 |
| 5,144,777 | 9/1992 | Fishel et al. | 52/144 |
| 5,335,722 | 8/1994 | Wu | 165/80.3 |
| 5,495,392 | 2/1996 | Shen | 361/697 |
| 5,497,825 | 3/1996 | Yu | 165/80.3 |
| 5,715,633 | 2/1998 | Raz et al. | 52/220.7 |
| 5,917,697 | 6/1999 | Wang | 165/80.3 |

Primary Examiner—Ira S. Lazarus
Assistant Examiner—Tho Duong
Attorney, Agent, or Firm—Wei Te Chung

[57] ABSTRACT

A heat sink module with a heat dissipating device comprises a heat sink, a clip, a fan with screws, a first attaching member, a pipe and a second attaching member. The first attaching member is used for attaching to an air opening of a computer enclosure. The first attaching member connects with the pipe and communicates with the air opening for transporting cool air therefrom. The second attaching member comprises a recessed base for attaching to the heat sink. The fan is received in the central portion of the recessed base, and is secured on the heat sink. Another end of the pipe communicates with the recessed base for transporting cool air from outside to cool the heat sink. Thus, heat dissipating efficiency is significantly improved.

6 Claims, 5 Drawing Sheets

HEAT SINK MODULE WITH HEAT DISSIPATING DEVICE

BACKGROUND OF THE INVENTION

The present invention relates to a heat sink module, and particularly to a heat sink module having an easy to assemble heat dissipating device for enhancing cooling efficiency and easy assembly.

During operation of a computer, heat is generated by the electrical elements thereof. As the processing speeds of CPUs increases, more heat is being generated. Thus, cooling the CPU package is an important consideration facing computer designers. Generally, a heat sink is used to dissipate heat generated by the CPU, and the heat is dissipated through a radiation process. However, heated air often can not freely flow out of a computer, nor cool air free flow in.

Taiwan Patent Application Nos. 84201729 and 86208700 disclose heat dissipating devices to overcome the above mentioned problems. The disclosed device comprises a heat sink defining rows of fins thereon. A channel is formed between adjacent fins. A fan is mounted on the heat sink for transporting cool air therefrom. The heat sink is closely attached to a CPU package. During operation, heat is generated by the CPU package and is conducted to the heat sink, and cool air is circulated by the fan to cool the heat sink. However, after a period of operation, a large mount of heated air is accumulated around the CPU package. The cooling efficiency is significantly reduced.

Therefore, a heat dissipating device is required for providing an effective cooling function.

BRIEF SUMMARY OF THE INVENTION

A main object of the present invention is to provide a heat sink with a heat dissipating device for effectively cooling a CPU package.

Another object of the present invention is to provide a heat sink with a heat dissipating device which is easy to assemble/disassemble.

To fulfill the above-mentioned objects, a heat sink module with a heat dissipating device according to a preferred embodiment of the present invention comprises a heat sink, a clip, a fan with attachment screws, a first attaching member, a pipe and a second attaching member. The first attaching member has a body for attaching to an air opening of a computer enclosure. Four barbs are formed on the body to secure the first attaching member to the air opening. Each barb further comprises a locking tip for in extending through a corresponding locking hole formed around the air opening. A stepped connection portion is formed on an opposite surface of the body for connecting with a corresponding linking part of the pipe. The stepped connection portion communicates with the air opening for transporting cool air therefrom. The pipe is made of flexible material, and forms two linking parts at either end thereof. The second attaching member comprises a recessed base for attaching to the heat sink. The fan is received in the central portion of the recessed base, and is secured on the heat sink by four screws. Two pairs of locking elements extend from two opposite edges of the recessed base, and each locking element comprises a barb portion and a handle portion. A pair of locking portions is formed at lateral sides of the heat sink and inwardly extend to engage with the barb portions of the second attaching member. A stepped connection portion is formed on the second attaching member for connecting with a linking part of the pipe. The stepped connection portion communicates with the fan for transporting cool air from outside to cool the heat sink. Thus, heat dissipating efficiency is significantly improved.

Other objects, advantages and novel features of the invention will become more apparent from the following detailed description when taken in conjunction with the accompanying drawings.

DETAILED DESCRIPTION OF THE INVENTION

Figure 1:
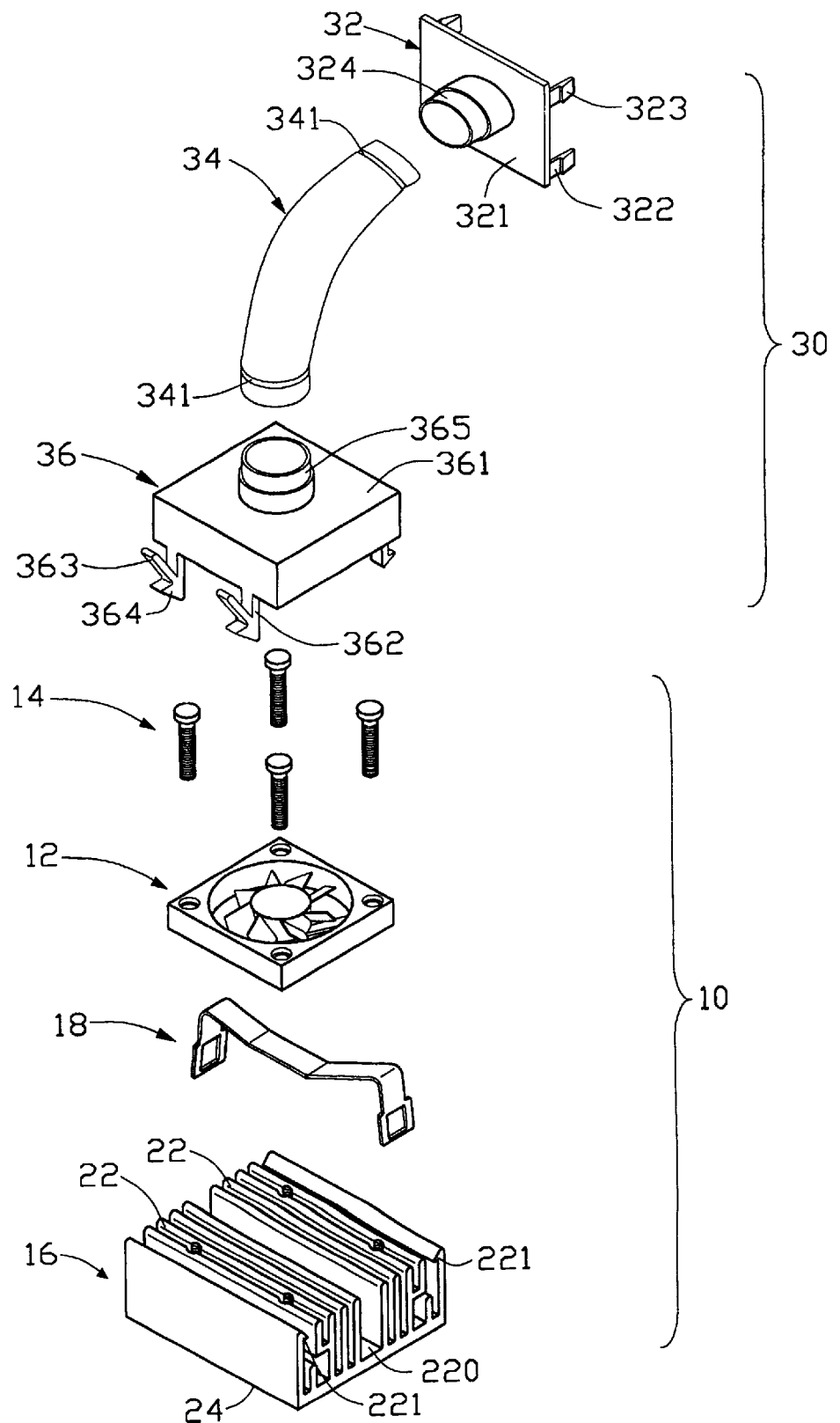
FIG. 1 is an exploded view of a heat sink with a heat dissipating device in accordance with the present invention.

Referring to FIG. 1, a heat sink module 10 comprises a heat sink 16, a clip 18 and a fan 12 attached to the heat sink 16 by four screws 14. The heat sink 16 is generally made of aluminum material and is mounted on a CPU package (not shown). The heat sink 16 forms a plurality of fins 22 thereon and has a flat bottom 24 for closely attaching to the CPU package. The fan 12 is fixed to the heat sink 16 with four screws 14. The clip 18 is received a channel 220 formed between the fins 22 for locking the heat sink 16 and the CPU package to a socket connector (not shown).

Figure 2:
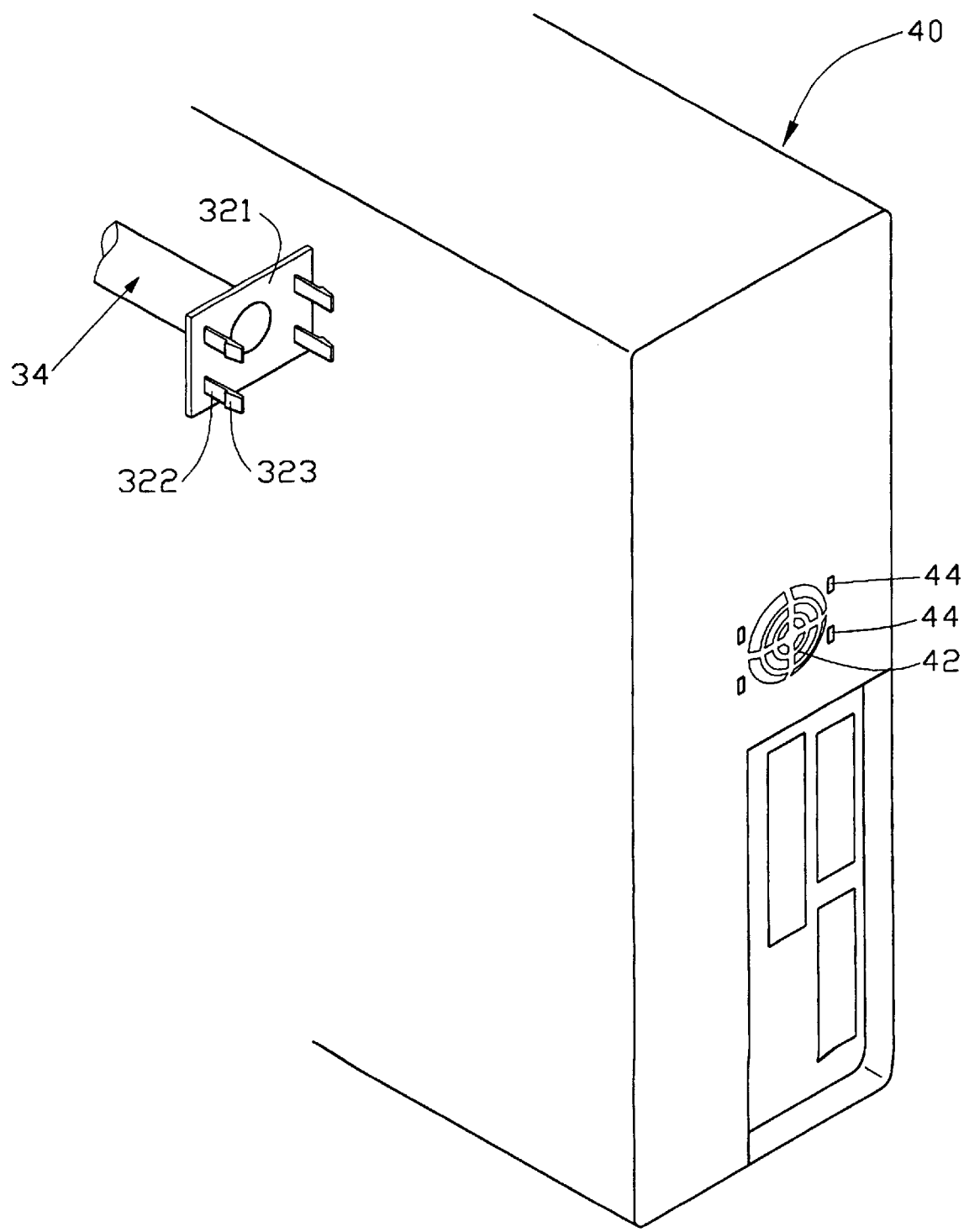
FIG. 2 is a partial, perspective view of the heat dissipating device and an enclosure in accordance with the present invention.
Figure 3:
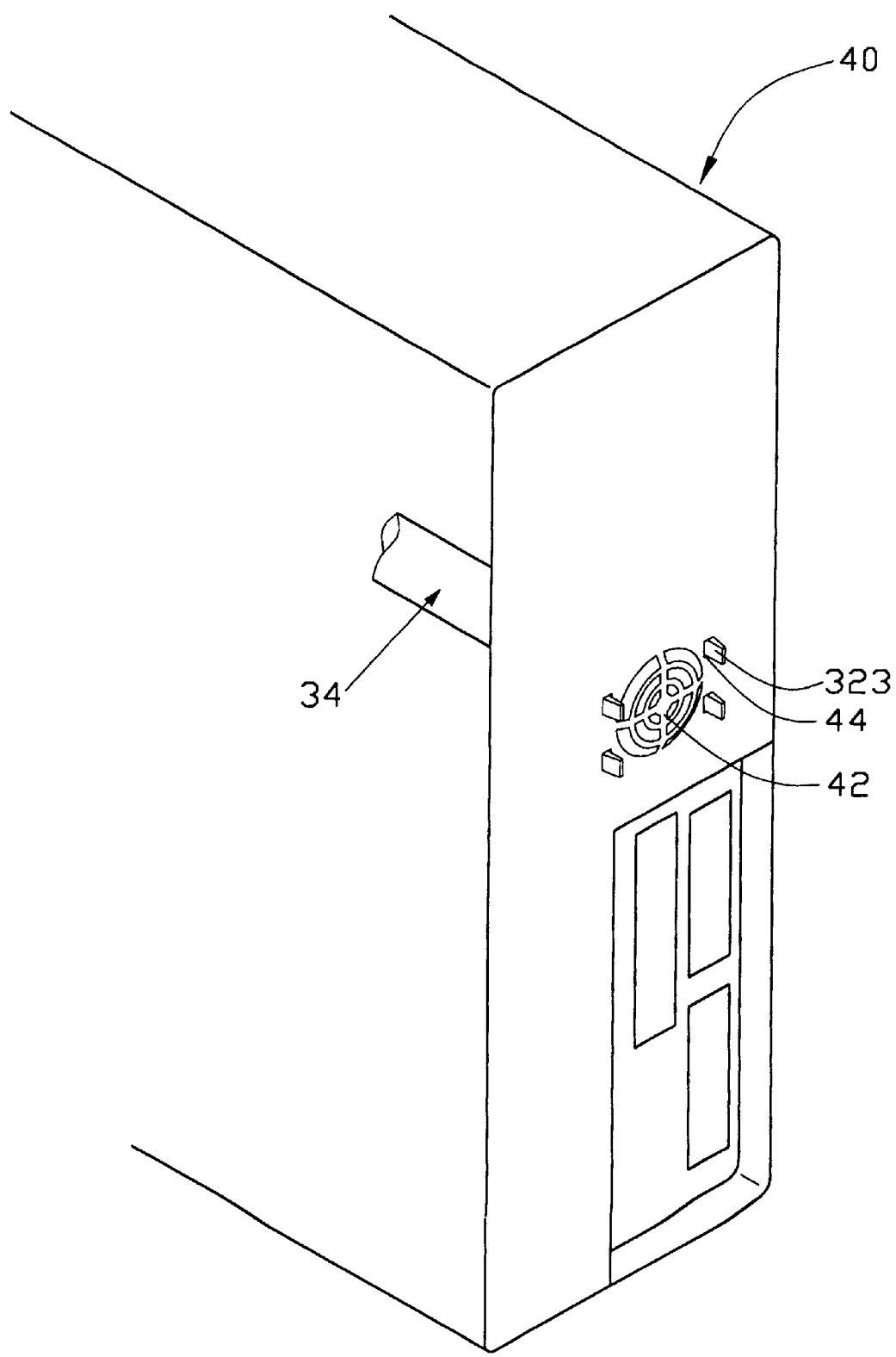
FIG. 3 is an assembled view of FIG. 2.

A heat dissipating device 30 comprises a first attaching member 32, a pipe 34 and a second attaching member 36. The first attaching member 32 has a body 321 for attaching to an air opening 42 of a computer enclosure 40 (FIG. 2). Four barbs 322 are formed on the body 321 to secure the first attaching member 32 to the air opening 42. Each barb 322 forms a locking tip 323 for extending through corresponding locking holes 44 formed around the air opening 42 (FIG. 3). A stepped connection portion 324 is formed on an opposite surface of the body 321 for connecting with a corresponding linking part 341 of the pipe 34. The stepped connection portion 324 communicates with the air opening 42 for transporting cool air therefrom.

The pipe 34 is made of a flexible material, and forms two linking parts 341 at both ends thereof.

Figure 4:
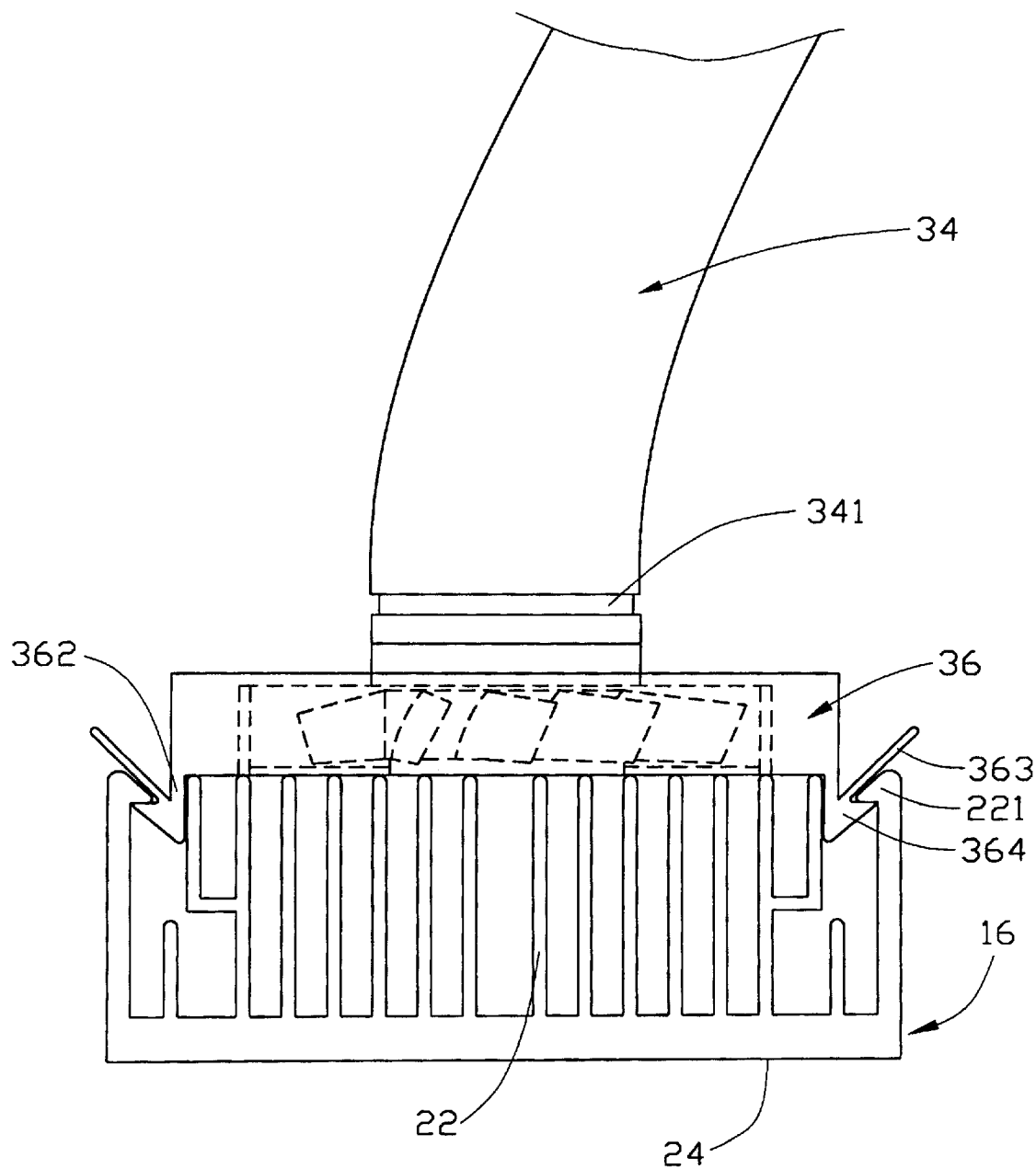
FIG. 4 is a side view of the heat dissipating device assembled with the heat sink module.

Referring to FIGS. 1 and 4, the second attaching member 36 comprises a recessed base 361 for attaching to the heat sink 16. The fan 12 is received in the central portion of the recessed base 361, and is secured on the heat sink 16 by four screws 14. Two pairs of locking elements 362 extend from two opposite edges of the recessed base 361, and each locking element 362 comprises a barb portion 364 and a handle portion 363. A pair of locking portions 221 is formed at lateral sides of the heat sink 16 and inwardly extend. In assembly, the barb portions 364 of the recessed base 361 are pressed down to engage with the corresponding locking portions 221 of the heat sink 16, therefore the second attaching member 36 is secured to the heat sink 16. The handle portion 363 is used to facilitate the process of disassembling the second attaching member 36 from the heat sink 16. A stepped connection portion 365 is formed on the second attaching member 36 for connecting with a linking portion 341 of the pipe 34. The stepped connection portion 365 communicates with the recessed base 361 for transporting cool air drown by the fan 12 from outside to cool the heat sink 16. In this way, heat dissipating efficiency is significantly improved.

Figure 5:
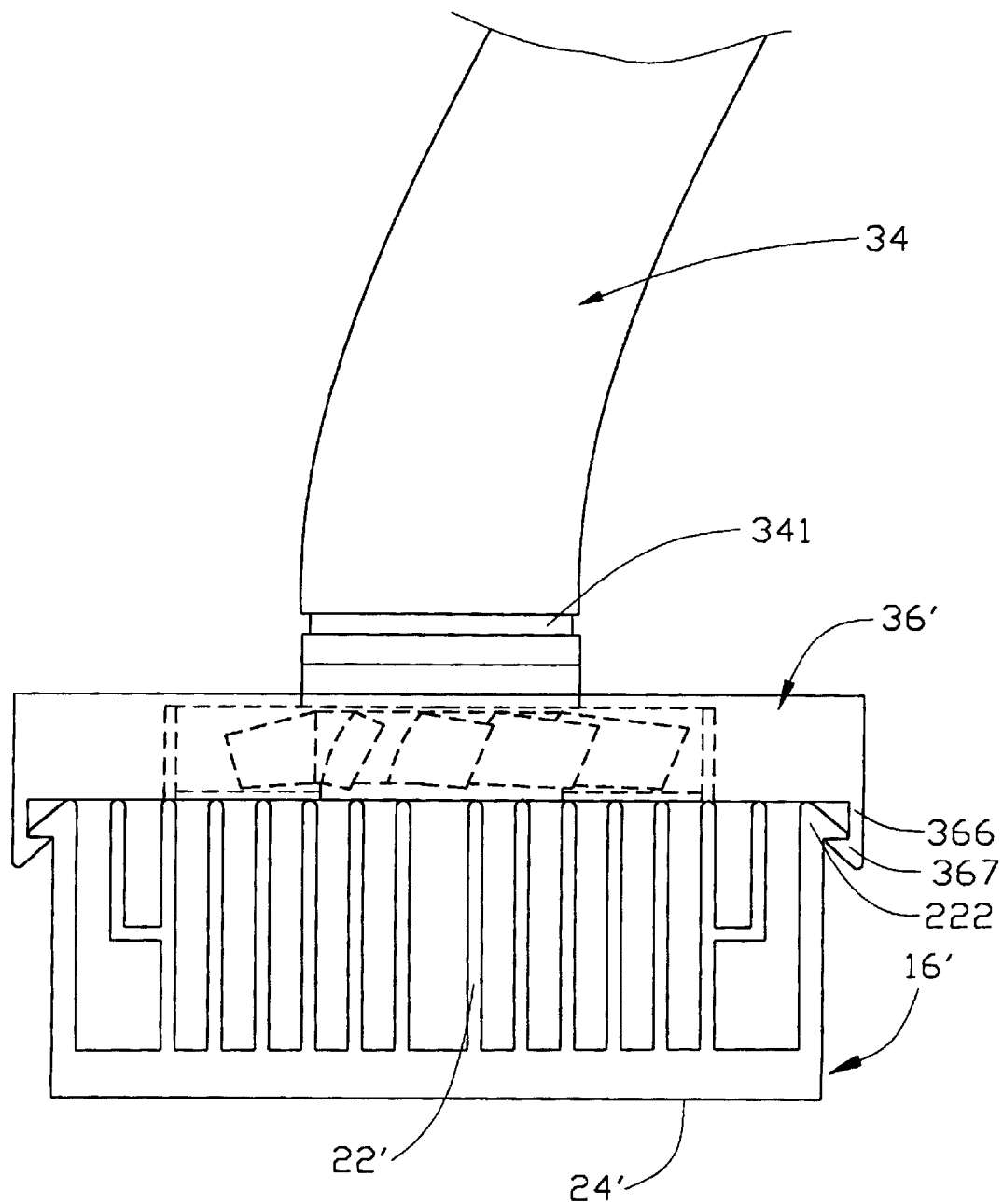
FIG. 5 is a side view of the heat dissipating device assembled with the heat sink module in accordance with an alternative embodiment of the invention.

FIG. 5 illustrates an alternative embodiment of the second attaching member 36' assembled to the heat sink 16'. The locking portions 222 of the heat sink 16' outwardly extend. The locking elements 366 are formed at lateral edges of the second attaching member 36', each locking element 366 comprising a barb portion 367 extending inwardly for locking with the corresponding locking portions 222. During the assembly process, the second attaching member 36' is pressed down, and the locking elements 366 are deflected outward to lock with the corresponding locking portions 222. Thus, the second attaching member 36' is securely mounted on the heat sink 16'.

During assembly, the clip 18 is received in the channel 220 for securing the heat sink 16 and the CPU to a socket connector. The fan 12 is secured to the heat sink 16 and is received in the recessed base 361 of the second attaching member 36. Then the first and second attaching members 32, 36 are respectively connected with the air opening 42 and the heat sink 16, and the first and second attaching members 32, 36 are linked through a flexible pipe 34. Furthermore, the recessed base 361 can be designed with a locking structure (not shown) for securing the fan 12 therein without additional attachment means such as the screws 14.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink module assembly comprising:
    a heat sink module including a heat sink and a fan mounted on the heat sink, the heat sink defining rows of fins thereon and a pair of locking portions formed at lateral sides thereof; and
    a heat dissipating device including:
        a first attaching member for attaching to an air opening of a computer enclosure;
        a second attaching member for attaching to the heat sink, the second attaching member defining a stepped connection portion thereon and a plurality of locking elements extending from lateral edges thereof, each locking element comprising a barb portion and a handle portion for facilitating the assembly/disassembly process with the locking portions of the heat sink, the barb portions extending outwardly while the corresponding locking portions of the heat sink extend inwardly for easily engaging with each other; and
        a flexible pipe connected between the first and the second attaching members.

2. The heat sink module assembly as claimed in claim 1, wherein the first attaching member forms a plurality of barbs and a stepped connection portion on opposite surfaces thereof.

3. The heat sink module assembly as claimed in claim 2, wherein each barb of the first attaching member forms a locking tip for extending through a corresponding locking hole formed around the air opening.

4. The heat sink module assembly as claimed in claim 2, wherein the stepped connection portion of the first attaching member communicates with the air opening for transporting cool air therefrom.

5. The heat sink module assembly as claimed in claim 1, wherein the fan is received in a central portion of a recessed base of the second attaching member.

6. The heat sink module assembly as claimed in claim 2, wherein the flexible pipe forms two linking parts at either end thereof for respectively connecting with corresponding stepped connection portions of the first and the second attaching members.

* * * * *